(12) United States Patent
Nakayama et al.

(10) Patent No.: US 11,012,042 B2
(45) Date of Patent: May 18, 2021

(54) RECEIVER MODULE

(71) Applicant: SUMITOMO ELECTRIC INDUSTRIES, LTD., Osaka (JP)

(72) Inventors: Kenichi Nakayama, Osaka (JP); Hiroshi Hara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 160 days.

(21) Appl. No.: 16/380,466

(22) Filed: Apr. 10, 2019

(65) Prior Publication Data

US 2019/0319594 A1     Oct. 17, 2019

(30) Foreign Application Priority Data

Apr. 13, 2018  (JP) .............................. JP2018-077427

(51) Int. Cl.
*H03F 3/45*     (2006.01)
*H05K 1/18*     (2006.01)
(52) U.S. Cl.
CPC ......... *H03F 3/45475* (2013.01); *H05K 1/181* (2013.01); *H05K 2201/10015* (2013.01); *H05K 2201/10121* (2013.01)
(58) Field of Classification Search
CPC . H03F 3/08; H03F 3/45475; H01L 31/02019; H05K 1/181; H05K 2201/10121; H05K 2201/10015; H05K 1/0231; H04B 10/60
See application file for complete search history.

(56) References Cited

U.S. PATENT DOCUMENTS

| | | | | |
|---|---|---|---|---|
| 2010/0025843 | A1* | 2/2010 | Iwaida | H01S 5/02212 257/693 |
| 2012/0070121 | A1* | 3/2012 | Ito | H03F 3/087 385/88 |
| 2014/0177625 | A1* | 6/2014 | Chang | H01L 23/5381 370/351 |
| 2016/0370686 | A1* | 12/2016 | Liao | G02B 6/13 |

FOREIGN PATENT DOCUMENTS

JP     2007274032 A     10/2007

* cited by examiner

*Primary Examiner* — Thanh Luu
*Assistant Examiner* — Monica T Taba
(74) *Attorney, Agent, or Firm* — Baker Botts L.L.P.; Michael A. Sartori

(57) ABSTRACT

A receiver module includes: a photodiode; a carrier configured to mount the photodiode; a base having a surface on which the carrier is mounted; a conductive pattern provided on the carrier, being conductively joined to a cathode electrode of the photodiode; a transimpedance amplifier having a first terminal connected to the conductive pattern through a bonding wire and a second terminal electrically connected to an anode electrode of the photodiode; and a capacitor having a first end electrically connected to the conductive pattern through a conductor having inductance smaller than inductance of the bonding wire and a second end electrically connected to the surface of the base.

8 Claims, 11 Drawing Sheets

US 11,012,042 B2

RECEIVER MODULE

TECHNICAL FIELD

The present disclosure relates to a receiver module.

BACKGROUND

Japanese Unexamined Patent Publication No. 2007-274032 discloses the configuration of an optical receiver including a photodiode and a transimpedance amplifier.

SUMMARY

A receiver module according to one embodiment includes: a photodiode; a carrier configured to mount the photodiode, the carrier having insulation; a base having a surface on which the carrier is mounted, the surface being conductive, the surface being at reference potential; a conductive pattern provided on the carrier, being conductively joined to a cathode electrode of the photodiode, and having a parasitic capacitance between the surface of the base and the conductive pattern; a transimpedance amplifier having a first terminal connected to the conductive pattern through a bonding wire and a second terminal electrically connected to an anode electrode of the photodiode; and a capacitor having a first end electrically connected to the conductive pattern through a conductor having inductance smaller than inductance of the bonding wire and a second end electrically connected to the surface of the base.

A receiver module according to another embodiment includes: a photodiode; a carrier configured to mount the photodiode, the carrier having insulation; a base having a surface on which the carrier is mounted, the surface being conductive, the surface being at reference potential; a conductive pattern provided on the carrier, being conductively joined to a cathode electrode of the photodiode, and having a parasitic capacitance between the surface of the base and the conductive pattern; a transimpedance amplifier having a first terminal connected to the conductive pattern through a bonding wire and a second terminal electrically connected to an anode electrode of the photodiode; and a capacitor having a first end including part of the conductive pattern or abutting on the conductive pattern and a second end electrically connected to the surface of the base.

DETAILED DESCRIPTION

Figure 11A:
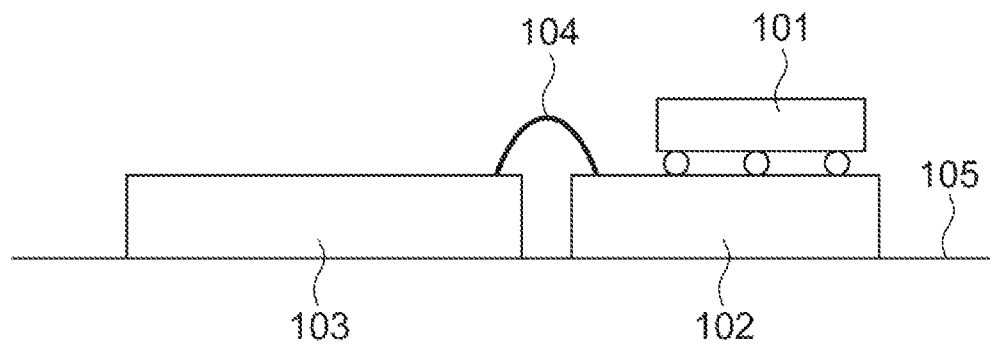
FIG. 11A illustrates a configuration in which a photodiode 101 is implemented on a carrier 102 having a wiring pattern and the wiring pattern on the carrier 102 and a TIA 103 are connected through a bonding wire 104.

In a receiver module, such as an optical receiver, a transimpedance amplifier (TIA) amplifies an electric signal output from a photodiode (e.g., a current signal). In that case, as illustrated in FIG. 11A, a photodiode 101 is implemented on a carrier 102 having a wiring pattern, and the wiring pattern on the carrier 102 is connected to a TIA 103 through a bonding wire 104. However, such a configuration has the following problems. That is, a parasitic capacitance occurs between the wiring pattern on the carrier 102 and a conductor 105 underneath the carrier 102. Due to recent high-speed optical communications, the frequency of optical signals has been increasing. For example, a frequency band of several tens of gigahertz, is likely to be used. The presence of the resonant frequency resulting from the capacitor and the inductance of the bonding wire 104 in such a frequency band, causes an impassable band to a signal, so that communication quality is likely to deteriorate, such as distortion in a signal waveform or inter-channel crosstalk.

Figure 11B:
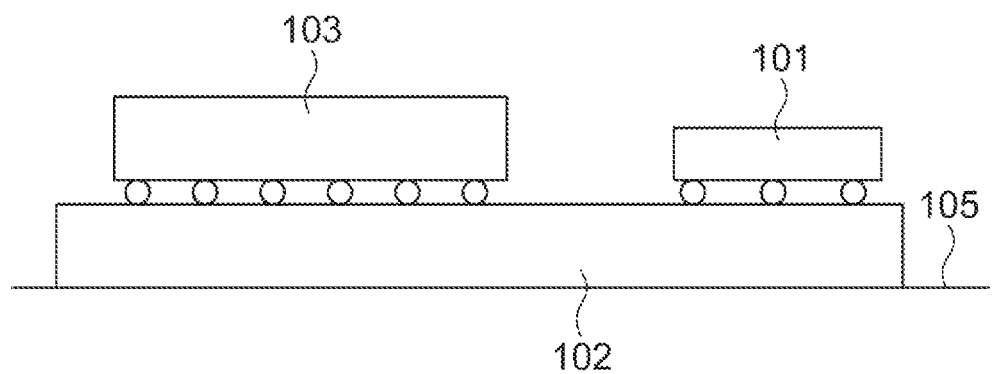
FIG. 11B illustrates a configuration in which a TIA 103 is implemented on a carrier 102 and a photodiode 101 and the TIA 103 are connected through only a wiring pattern on the carrier 102.

Note that, as a technique of reducing the inductance between the photodiode 101 and the TIA 103, as illustrated in FIG. 11B, it is considered that a TIA 103 is implemented on a carrier 102 (e.g., flip-chip bonding) and a photodiode 101 and the TIA 103 are connected through only a wiring pattern on the carrier 102. However, such a method requires a TIA having dedicated pads for flip-chip bonding, and thus cannot employ a general-purpose TIA, resulting in a rise in manufacturing costs.

An object of the present disclosure is to provide a receiver module including a photodiode and a TIA connected through a bonding wire, the receiver module being capable of shifting an impassable band due to resonance, to high frequency.

A receiver module according to one embodiment of the present disclosure, includes a photodiode and a TIA connected through a bonding wire, the receiver module being capable of shifting an impassable band due to resonance, to high frequency.

DESCRIPTION OF EMBODIMENT OF PRESENT DISCLOSURE

First, the contents of an embodiment of the present disclosure will be given for description. A first receiver module according to one embodiment includes: a photodiode; a carrier configured to mount the photodiode, the carrier having insulation; a base having a surface on which the carrier is mounted, the surface being conductive, the surface being at reference potential; a conductive pattern provided on the carrier, being conductively joined to a cathode electrode of the photodiode, and having a parasitic capacitance between the surface of the base and the conductive pattern; a transimpedance amplifier having a first terminal connected to the conductive pattern through a bonding wire and a second terminal electrically connected to an anode electrode of the photodiode; and a capacitor having a first end electrically connected to the conductive pattern through a conductor having inductance smaller than inductance of the bonding wire and a second end electrically connected to the surface of the base.

In the first receiver module, the capacitor is provided between the conductive pattern and the surface of the base, separately from the parasitic capacitance formed between the conductive pattern on the carrier and the surface of the base. The inductance of the conductor connecting the conductive pattern and the capacitor is smaller than the inductance of the bonding wire. Such a configuration provides a circuit including an inductance and a capacitor connected in series, between the conductive pattern and the surface of the base, and additionally can make the resonant frequency thereof higher than the resonant frequency resulting from the conductive pattern and the bonding wire. Thus, the resonant frequency of the entire circuit can increase, so that an impassable band due to resonance can be shifted to high frequency.

In the first receiver module, the conductor may include material identical to that of the bonding wire, and may be a conductor thicker than the bonding wire. For example, such a configuration can make the inductance of the conductor smaller than the inductance of the bonding wire, easily.

A second receiver module according to one embodiment includes: a photodiode; a carrier configured to mount the photodiode, the carrier having insulation; a base having a surface on which the carrier is mounted, the surface being conductive, the surface being at reference potential; a conductive pattern provided on the carrier, being conductively joined to a cathode electrode of the photodiode, and having a parasitic capacitance between the surface of the base and the conductive pattern; a transimpedance amplifier having a first terminal connected to the conductive pattern through a bonding wire and a second terminal electrically connected to an anode electrode of the photodiode; and a capacitor having a first end including part of the conductive pattern or abutting on the conductive pattern and a second end electrically connected to the surface of the base.

In the second receiver module, the capacitor is provided between the conductive pattern and the surface of the base, separately from the parasitic capacitance formed between the conductive pattern on the carrier and the surface of the base. The one end of the capacitor includes the part of the conductive pattern or abuts on the conductive pattern. With such a configuration, the inductance between the conductive pattern and the capacitor is close to zero (or substantially zero), so that the resonant frequency between the conductive pattern and the surface of the base, can be made remarkably higher than the resonant frequency resulting from the conductive pattern and the bonding wire. Thus, the resonant frequency of the entire circuit can increase, so that an impassable band due to resonance can be shifted to high frequency.

In the second receiver module, the capacitor may be a silicon capacitor. For example, such a configuration allows easy achievement of the capacitor and enables the one end of the capacitor to include the part of the conductive pattern or abut on the conductive pattern.

In the first or second receiver module, the capacitance of the capacitor may be larger than the capacitance of the parasitic capacitor. This arrangement enables reduction of the influence of the capacitor on the signal-transmission characteristic in a high frequency band of several tens of megahertz.

In the first or second receiver module, the photodiode may be conductively joined between a connection of the conductive pattern with the capacitor, and a connection of the conductive pattern with the bonding wire. For example, such a configuration enables disposition of the capacitor without interfering with provision of the bonding wire.

DETAILS OF EMBODIMENT OF PRESENT DISCLOSURE

A specific exemplary receiver module according to the embodiment of the present disclosure, will be described below with reference to the drawings. Note that the present invention is not limited to the exemplification and is indicated in the claims. The present invention is intended to include all alterations within the meaning and scope of equivalents of the claims. The same elements are denoted with the same reference signs in the description of the drawings in the following descriptions, and thus the duplicate descriptions thereof will be omitted.

Figure 1:
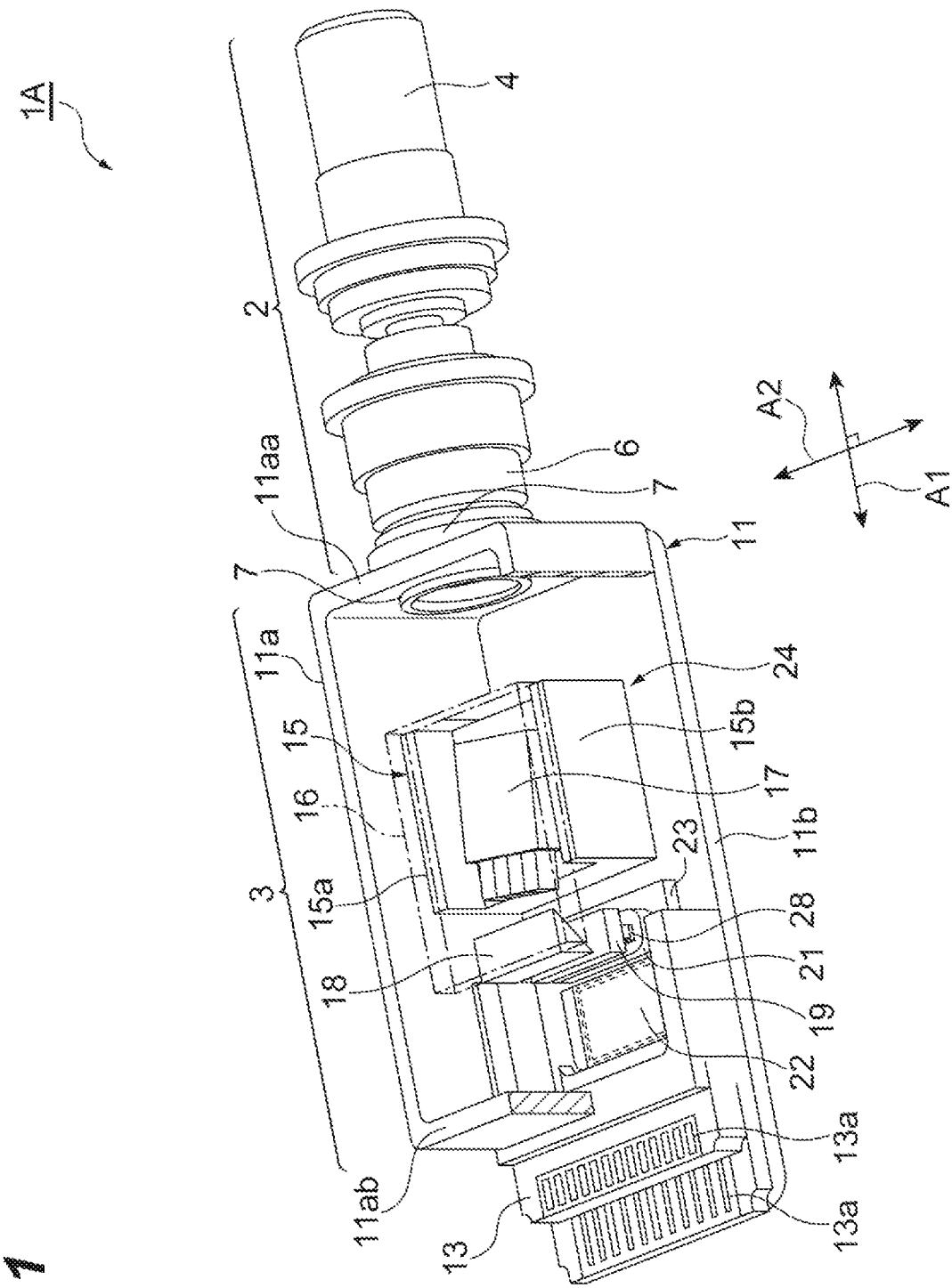
FIG. 1 is a perspective view of the configuration of a receiver module 1A according to one embodiment of the present disclosure.

FIG. 1 is a perspective view of the configuration of a receiver module 1A according to one embodiment of the present disclosure. FIG. 1 illustrates the receiver module 1A with a lid of a package removed and part of a side wall of the package removed, for ease of description. The receiver module 1A is used as a receiver optical sub-assembly (ROSA) of an optical transceiver. As illustrated in FIG. 1, the receiver module 1A according to the present embodiment includes a receptacle 2, a housing 3, and two flexible printed circuits (FPCs) not illustrated.

The housing 3 includes the package 11. The package 11 that is a hollow case substantially in a box-shaped, includes the metallic side wall 11a and a metallic plate 11b. The plate 11b that is rectangular and flat, extends along a plane prescribed by a direction A1 and a direction A2 intersecting with the direction A1 (e.g., orthogonal). As constituent material for the plate 11b, metal, such as copper molybdenum or copper tungsten, can be used. Use of material having highly thermal conductivity enables improvement of heat dissipation. The side wall 11a that is a rectangular frame, is disposed along the circumferential edge of the plate 11b. The side wall 11a includes a pair of side walls 11aa and 11ab extending along a plane intersecting with the direction A1. The pair of side walls 11aa and 11ab is arrayed along the direction A1. The opening of the side wall 11a, opposite to the plate 11b, is tightly covered with the lid not illustrated.

The receptacle 2 that is a substantially cylindrical member extending along the direction A1, is disposed at the side wall 11aa. The leading end of the receptacle 2 is connected to an optical fiber through which signal light travels. Specifically, the receptacle 2 includes a sleeve 4 into which a ferrule of the optical connector is inserted, and a holder 6 secured to the housing 3. The sleeve 4 and the holder 6 that each are cylindrical and extend along the direction A1, are arrayed in this order along the direction A1.

One end of the holder 6 in the direction A1 is secured to the side wall 11aa through a bush 7 provided at the opening of the side wall 11aa. The other end of the holder 6 is secured to the sleeve 4. A stub abutting on the ferrule of the optical fiber, is disposed in the sleeve 4. A lens that collimates the signal light emitted from the stub, is disposed in the holder 6. An optical window is disposed in the bush 7. The signal light emitted from the optical fiber reaches the lens through the stub. The signal light collimated by the lens, passes through the optical window so as to be captured inside the package 11.

The housing 3 includes a feed-through 13, carriers 15 and 16, an optical demultiplexer 17, a mirror 18, an array lens 19, a transimpedance amplifier (TIA) 22, and a base 23. Each component except the feed-through 13 is housed in the package 11.

The feed-through 13 disposed at the side wall 11ab, performs electric connection with an external circuit. For example, the feed-through 13 formed of a plurality of ceramic substrates layered one on another, is assembled such that the feed-through 13 engages with the opening of the side wall 11ab. A portion of the feed-through 13 located outside the side wall 11ab, is provided with a plurality of terminals 13a for the electric connection with the external circuit. The terminals 13a are conductively joined to the FPCs with, for example, solder. A portion of the feed-through 13 located inside the side wall 11ab, is provided with a plurality of terminals for electric connection with the TIA 22. The plurality of terminals inside the side wall 11ab and the plurality of terminals 13a outside the side wall 11ab are mutually short-circuited through wiring embedded in the feed-through 13.

The optical demultiplexer 17 is optically coupled to the optical fiber through the lens in the holder 6 and the optical window in the bush 7. The optical demultiplexer 17 demultiplexes the signal light that is wavelength-multiplexed, output from the optical fiber, into a plurality of signal-light components having mutually different wavelengths. The optical demultiplexer 17 is supported by the carrier 16. More specifically, the carrier 16 that is a tabular member extending along the plane prescribed by the direction A1 and the direction A2, has a flat back face opposed to the bottom of the package 11 and a flat surface located opposite to the back face. The optical demultiplexer 17 is secured to the back face of the carrier 16 through adhesive. The carrier 16 is made of, for example, ceramic, such as aluminum oxide (alumina).

The carrier 16 is disposed on the carrier 15. The carrier 15 provided between the plate 11b of the package 11 and the carrier 16, supports the back face of the carrier 16. The carrier 15 includes a pair of poles 15a and 15b supporting both edges along the direction A1 of the carrier 16. The pair of poles 15a and 15b each extend along the direction A1 with the optical demultiplexer 17 interposed therebetween. The pair of poles 15a and 15b forms a space for the disposition of the optical demultiplexer 17, between the back face of the carrier 16 and the carrier 15. The carrier 15 is made of material, such as aluminum oxide, aluminum nitride, copper molybdenum, or copper tungsten, having a coefficient of linear expansion close to that of the carrier 16.

The mirror 18 is secured to the back face of the carrier 16 through adhesive. The mirror 18 reflects and guides the plurality of signal-light components output from the optical demultiplexer 17, to a plurality of photodiodes 20 to be described later (refer to FIG. 2), respectively. The mirror 18 includes, for example, a prism. The array lens 19 is disposed on the optical path between the mirror 18 and the plurality of photodiodes 20. The array lens 19 including a plurality of convex lenses, condenses the plurality of signal-light components, to the plurality of photodiodes 20, respectively. The array lens 19 is disposed on the plate 11b through a sub-carrier 28, a carrier 21, and the base 23.

The base 23 is a tabular member disposed, near to the feed-through 13, in the package 11. At least, the surface of the base 23 has conductivity, and the surface is set at reference potential. As one example, the base 23 is metallic. The base 23 is disposed on the plate 11b such that the surface of the base 23 faces counter to the plate 11b of the package 11.

Figure 2:
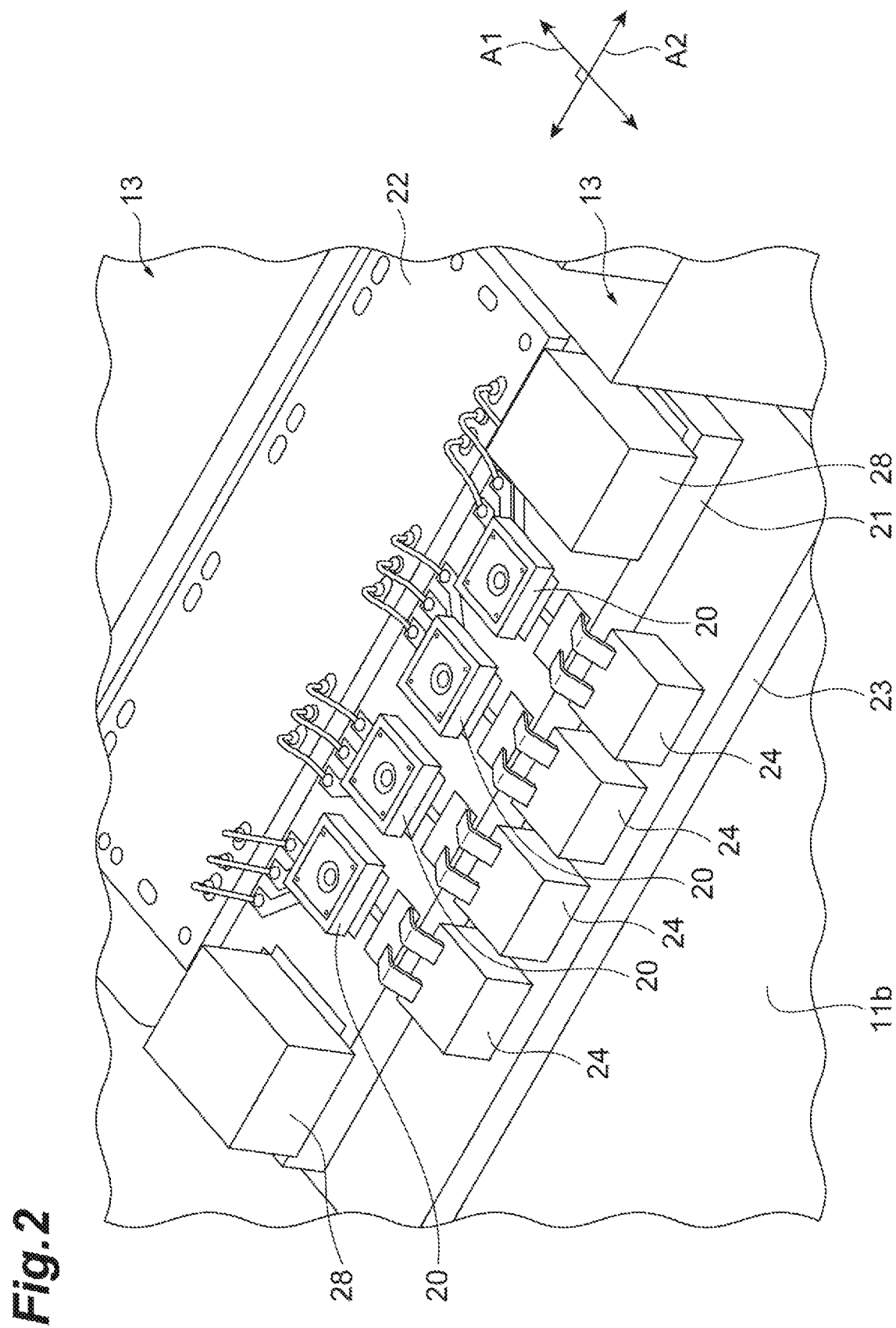
FIG. 2 is an enlarged perspective view of a structure in the vicinity of a plurality of photodiodes 20.

FIG. 2 is an enlarged perspective view of a structure in the vicinity of the plurality of photodiodes 20. The receiver module 1A according to the present embodiment, further includes the plurality of photodiodes 20. The plurality of photodiodes 20 mounted on the carrier 21 provided on the surface of the base 23, is disposed in the direction intersecting with both of the directions A1 and A2 with respect to the mirror 18 (refer to FIG. 1) (namely, the normal direction of the bottom of the package 11). The carrier 21 extends along the direction A2 in a rectangular parallelepiped, and the plurality of photodiodes 20 is arrayed along the direction A2 on the carrier 21. FIG. 2 illustrates four photodiodes 20 as one example. However, the number of photodiodes 20 is not limited to this, and thus may be any number of one or more.

Each photodiode 20 is a semiconductor element that converts the corresponding signal-light component into an electric signal. Each photodiode 20 is optically coupled to the optical demultiplexer 17 through the array lens 19 and the mirror 18. Each photodiode 20 is electrically connected to the TIA 22. The TIA 22 disposed between the plurality of photodiodes 20 and the feed-through 13, converts a current signal from each photodiode 20, into a voltage signal. The TIA 22 is electrically connected to the wiring of the feed-through 13 through bonding wires not illustrated. The voltage signal output from the TIA 22 is output outside the receiver module 1A through the feed-through 13.

The receiver module 1A according to the present embodiment, further includes a plurality of capacitors 24. The capacitors 24 are mounted on the base 23. The plurality of capacitors 24 is arrayed along the direction A2 on the base 23. One end of each capacitor 24 is electrically connected to the corresponding photodiode 20. The other end of each capacitor 24 is electrically connected to the surface of the base 23 that is conductive. Each capacitor 24 is disposed opposite the TIA 22 across the corresponding photodiode 20 in the direction A1. In other words, when viewed in the normal direction of a face of the plate 11b, the photodiodes 20 are disposed between the capacitors 24 and the TIA 22.

Figure 3:
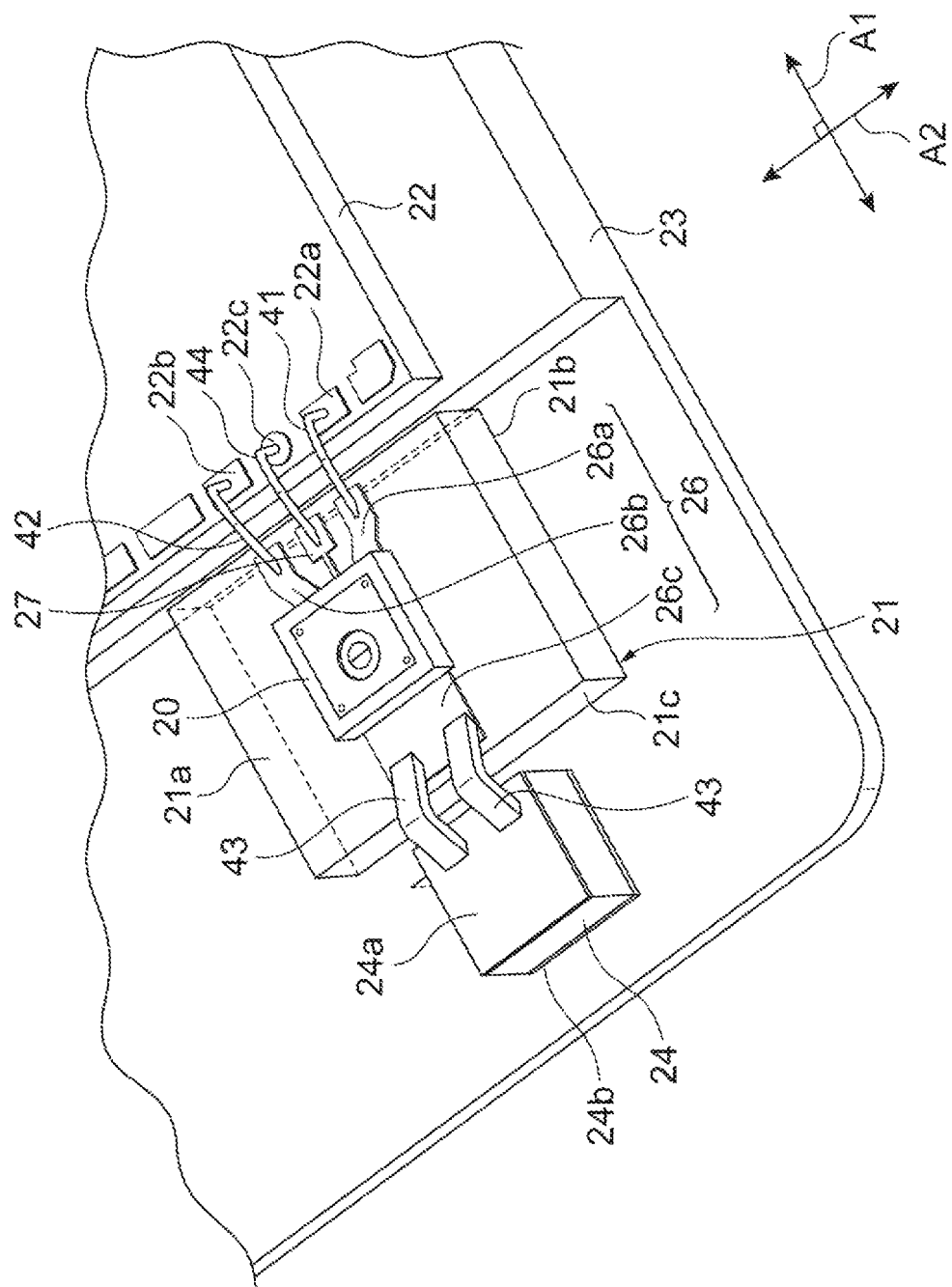
FIG. 3 is an enlarged perspective view of a structure in the vicinity of a capacitor 24.

FIG. 3 is an enlarged perspective view of a structure in the vicinity of one capacitor 24. For convenience, FIG. 3 illustrates only a portion of the carrier 21 corresponding to one photodiode 20 and the one capacitor 24. A structure in the vicinity of each of the other capacitors 24 is similar to that of FIG. 3. The carrier 21 on which the photodiode 20 is mounted, includes a dielectric and has insulation. The carrier 21 in a rectangular parallelepiped, has a surface 21a, a back face 21b, and a side face 21c. The back face 21b opposed to the surface of the base 23, is joined to the base 23 through, for example, adhesive.

Conductive patterns 26 and 27 are provided on the surface 21a. The conductive pattern 26 that is a metal pattern adhering to the surface 21a, is conductively joined to a cathode electrode provided on the back face of the photodiode 20 (face opposite to the receptive face) through conductive adhesive, such as solder. The conductive pattern 26 includes a portion located immediately underneath the photodiode 20, a pair of portions 26a and 26b extending from the photodiode 20 toward the TIA 22, and a portion 26c extending from the photodiode 20 toward the capacitor 24. The conductive pattern 26 forms a parasitic capacitance between the surface of the base 23 and the conductive pattern 26.

The portion 26a of the conductive pattern 26 is electrically connected to a bias terminal 22a (first terminal) of the TIA 22 through a bonding wire 41. That is, one end of the bonding wire 41 is joined to the portion 26a of the conductive pattern 26, and the other end of the bonding wire 41 is joined to the bias terminal 22a of the TIA 22. Similarly, the portion 26b of the conductive pattern 26 is electrically connected to a bias terminal 22b of the TIA 22 through a bonding wire 42. That is, one end of the bonding wire 42 is joined to the portion 26b of the conductive pattern 26, and the other end of the bonding wire 42 is joined to the bias terminal 22b of the TIA 22. Supply (bias) voltage is input from the bias terminals 22a and 22b of the TIA 22 into the conductive pattern 26 through the bonding wires 41 and 42. The TIA 22 is mounted on the surface of the base 23, and the ground potential (reference potential) of the TIA 22 is identical to the potential of the surface of the base 23.

The capacitor 24 is a capacitive element, such as a chip capacitor. The capacitance of the capacitor 24 is larger than the capacitance of the parasitic capacitor between the conductive pattern 26 and the surface of the base 23. As an example, the capacitance of the parasitic capacitor between the conductive pattern 26 and the surface of the base 23 is in a range of from 10 fF to 100 fF, and the capacitance of the capacitor 24 is 1 pF or more. The capacitor 24 has a pair of end faces arrayed in the normal direction of the surface of the base 23. An electrode 24a is formed on one end face, and another electrode 24b is formed on the other end face. The portion 26c of the conductive pattern 26 is electrically connected to one end (electrode 24a) of the capacitor 24 through a conductor 43. That is, one end of the conductor 43 is joined to the portion 26c of the conductive pattern 26, and the other end of the conductor 43 is joined to the electrode 24a of the capacitor 24. Thus, the photodiode 20 is conductively joined between a connection of the conductive pattern 26 with the capacitor 24, and connections of the conductive pattern 26 with the bonding wires 41 and 42. The conductor 43 is a conductor, such as a gold ribbon or a bonding wire. Note that the figure illustrates two conductors 43, but the number of conductors 43 can be set to any number of one or more. The collective inductance of all the conductors 43 is smaller than the collective inductance of the bonding wires 41 and 42. Thus, when the constituent material of the conductors 43 and the constituent material of the bonding wires 41 and 42 are the same, a conductor thicker than the bonding wires 41 and 42, is used for each conductor 43. The other end (electrode 24b) of the capacitor 24 is conductively joined to the surface of the base 23 through conductive adhesive, such as solder.

The conductive pattern 27 that is a metal pattern adhering to the surface 21a, is conductively joined to an anode electrode provided on the back face of the photodiode 20 through conductive adhesive, such as solder. The conductive pattern 27 extends from immediately underneath the photodiode 20 toward the TIA 22. The conductive pattern 27 is electrically connected to a signal terminal 22c (second terminal) of the TIA 22 through a bonding wire 44. That is, one end of the bonding wire 44 is joined to the conductive pattern 27, and the other end of the bonding wire 44 is joined to the signal terminal 22c of the TIA 22. A current signal generated by the photodiode 20 in accordance with the amount of incident light, is sent to the signal terminal 22c of the TIA 22 through the bonding wire 44. The TIA 22 converts the current signal into a voltage signal.

Exemplary numerical values of the receiver module 1A are given as follows:

Length of each of the bonding wires 41 and 42: 0.2 mm

Inductance of each of the bonding wires 41 and 42: 0.3 nH

Length of each conductor 43: 0.2 mm

Inductance of each conductor 43: 0.2 nH

Thickness of the carrier 21: 0.4 mm

Length in the direction A1 of the carrier 21: 1.1 mm

Planar dimension of the capacitor 24: 0.38 mm

Capacitance of the capacitor 24: 330 pF

Figure 4A:
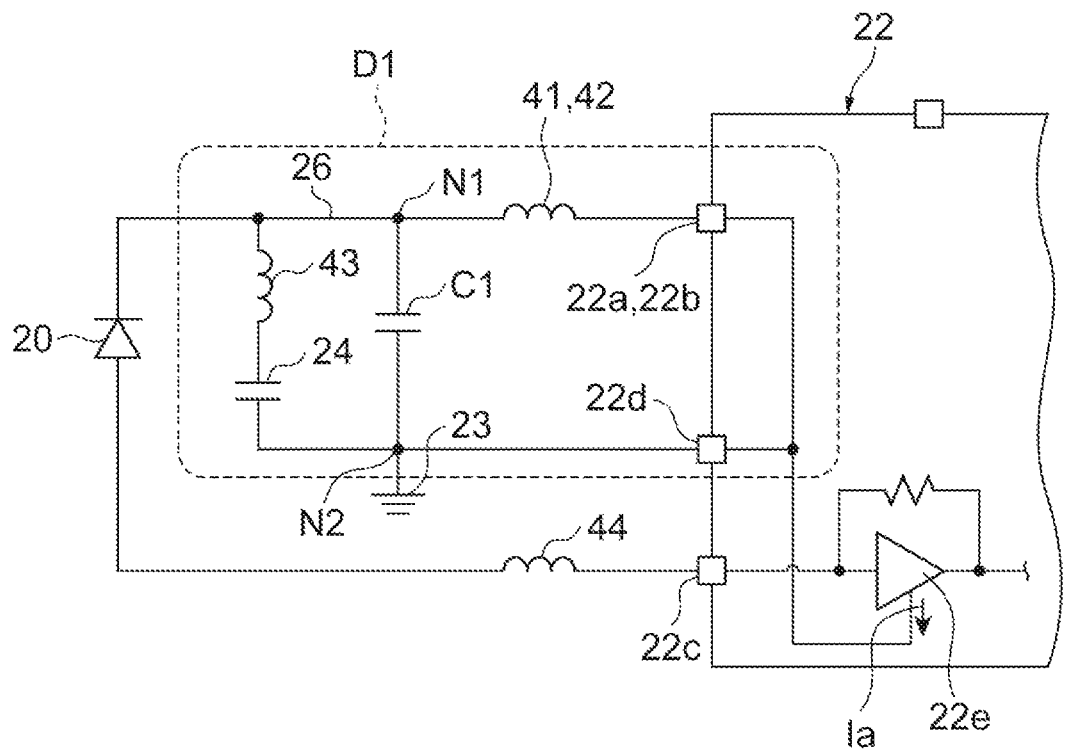
FIG. 4A is an equivalent circuit diagram of the receiver module 1A.

Parasitic capacitance between the conductive pattern 26 and the surface of the base 23: 50 fF Effect acquired by the receiver module 1A according to the present embodiment described above, will be described together with a problem a receiver module according to a comparative example has. FIG. 4A is an equivalent circuit diagram of the receiver module 1A according to the present embodiment. As illustrated in FIG. 4A, the receiver module 1A according to the present embodiment, has the cathode of a photodiode 20 connected to the bias terminals 22a and 22b of the TIA 22 through the bonding wires 41 and 42 (indicated as an inductance in the figure). The anode of the photodiode 20 is connected to an amplifier circuit 22e of the TIA 22 through the bonding wire 44 and the signal terminal 22c of the TIA 22. A ground terminal 22d of the TIA 22 is connected to the base 23 (indicated as a reference potential line (ground line) in the figure). The capacitor C1 is present between the conductive pattern 26 between the photodiode 20 and the bonding wires 41 and 42, and the base 23. The conductors 43 and the capacitor 24 mutually connected in series are connected in parallel with the capacitor C1 between the conductive pattern 26 and the base 23.

Figure 4B:
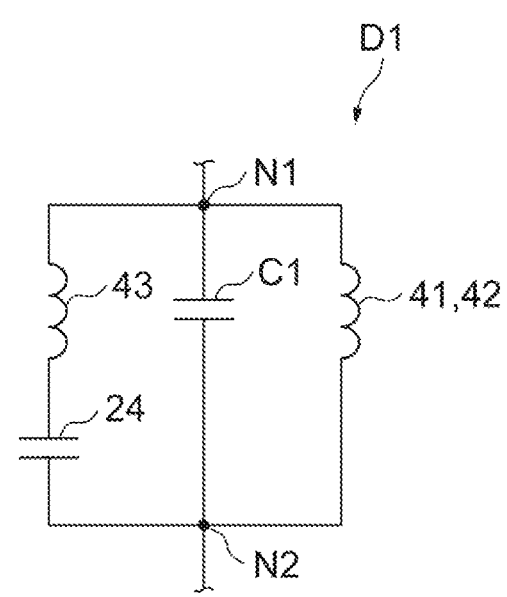
FIG. 4B is an equivalent circuit diagram of a circuit D1 extracted from FIG. 4A.

FIG. 4B is an equivalent circuit diagram of a circuit D1 extracted from FIG. 4A. As illustrated in the figure, the circuit D1 includes a series circuit of the conductors 43 and the capacitor 24, the capacitor C1, and the combined inductance of the bonding wires 41 and 42, connected in parallel with each other between a node N1 and a node N2. The node N1 is connected to the cathode of the photodiode 20, and the node N2 is connected to the base 23 (namely, the reference potential).

Figure 5A:
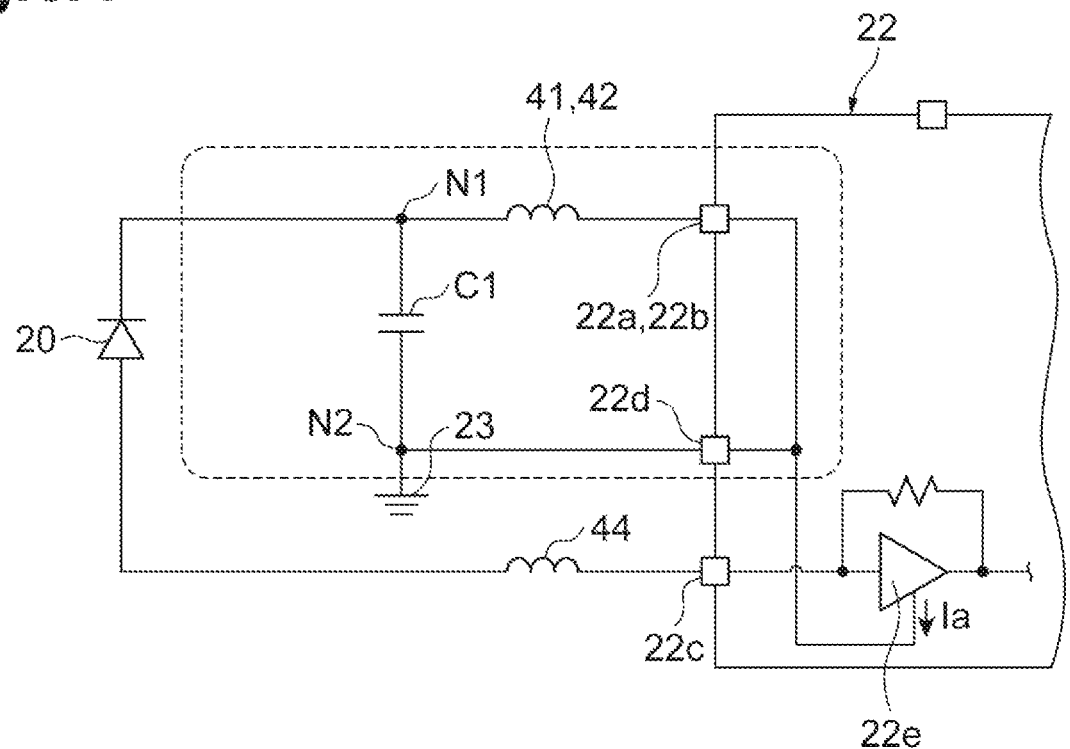
FIG. 5A is an equivalent circuit diagram of a receiver module according to a comparative example.
Figure 5B:
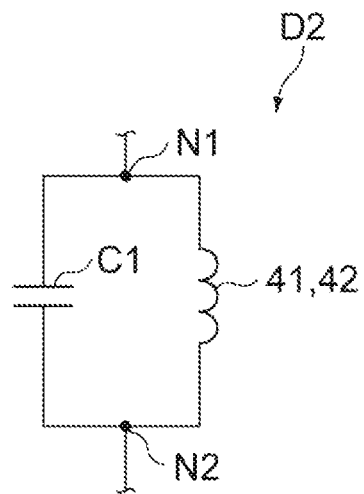
FIG. 5B is an equivalent circuit diagram of a circuit D2 extracted from FIG. 5A.

Meanwhile, FIG. 5A is an equivalent circuit diagram of the receiver module according to the comparative example. The receiver module according to the comparative example is provided with no series circuit of conductors 43 and a capacitor 24, differently from the receiver module 1A according to the present embodiment (refer to FIG. 4A). Thus, due to extraction of a circuit D2 from FIG. 5A, as illustrated in FIG. 5B, a capacitor C1 and the combined inductance of bonding wires 41 and 42 are connected in parallel with each other between a node N1 and a node N2.

The circuits D1 and D2 each include an LC resonant circuit. Approach of the resonant frequency of the LC resonant circuit to a signal frequency, reduces current Ia from the amplifier circuit 22e of the TIA 22 to the photodiode 20. At this time, the current signal is inhibited from flowing from the photodiode 20 to the amplifier circuit 22e, resulting in signal impassability. Here, when the capacitance of the capacitor C1 is defined as $C_t$ and the combined inductance of the bonding wires 41 and 42 is defined as $L_{wire}$, the admittance of the LC resonant circuit according to the comparative example illustrated in FIG. 5B is expressed by

[Mathematical Formula 1]

$$Y = \frac{1}{j\omega L_{wire}} + j\omega C_t \quad (1)$$
$$= \frac{1 - \omega^2 L_{wire} C_t}{j\omega L_{wire}}$$

and Y=0, namely, the resonant frequency is expressed by

[Mathematical Formula 2]

$$f = \frac{1}{2\pi}\sqrt{\frac{1}{L_{wire}C_t}} \quad (2)$$

Meanwhile, the capacitor 24 is considered to be short-circuited to high frequency because the capacitance of the capacitor 24 is sufficiently large in the LC resonant circuit according to the present embodiment illustrated in FIG. 4B. When the inductance of the conductors 43 is defined as $L_b$, the admittance is expressed by

[Mathematical Formula 3]

$$Y = \frac{1}{j\omega L_{wire}} + j\omega C_t + \frac{1}{j\omega L_b} \quad (3)$$
$$= \frac{L_{wire} + L_b - \omega^2 L_{wire} L_b C_t}{j\omega L_{wire} L_b}$$

and Y=0, namely, the resonant frequency is expressed by

[Mathematical Formula 4]

$$f = \frac{1}{2\pi}\sqrt{\frac{L_{wire} + L_b}{L_{wire}L_b C_t}} \quad (4)$$

Assuming that the inductance $L_b$ is sufficiently smaller than the inductance $L_{wire}$, Expression (4) results in

[Mathematical Formula 5]

$$f = \frac{1}{2\pi}\sqrt{\frac{L_{wire}}{L_{wire}L_b C_t}} = \frac{1}{2\pi}\sqrt{\frac{1}{L_b C_t}} \quad (5)$$

That is, as expressed by Expression (2), the inductance $L_{wire}$ mainly affects the resonant frequency f in the LC resonant circuit according to the comparative example. However, the inductance $L_b$ mainly affects the resonant frequency f in the LC resonant circuit according to the present embodiment. As described above, because the inductance $L_b$ is smaller than the inductance $L_{wire}$, the resonant frequency f according to the present embodiment is higher than the resonant frequency f according to the comparative example. Thus, the receiver module 1A according to the present embodiment enables increase of the resonant frequency of the LC resonant circuit including the capacitor C1 and the bonding wires 41 and 42, so that an impassable band to a signal, due to resonance, can be shifted to high frequency. Therefore, the receiver module 1A is controlling the quality of transmission properties, such as distortion in a signal waveform or inter-channel crosstalk.

Figure 6:
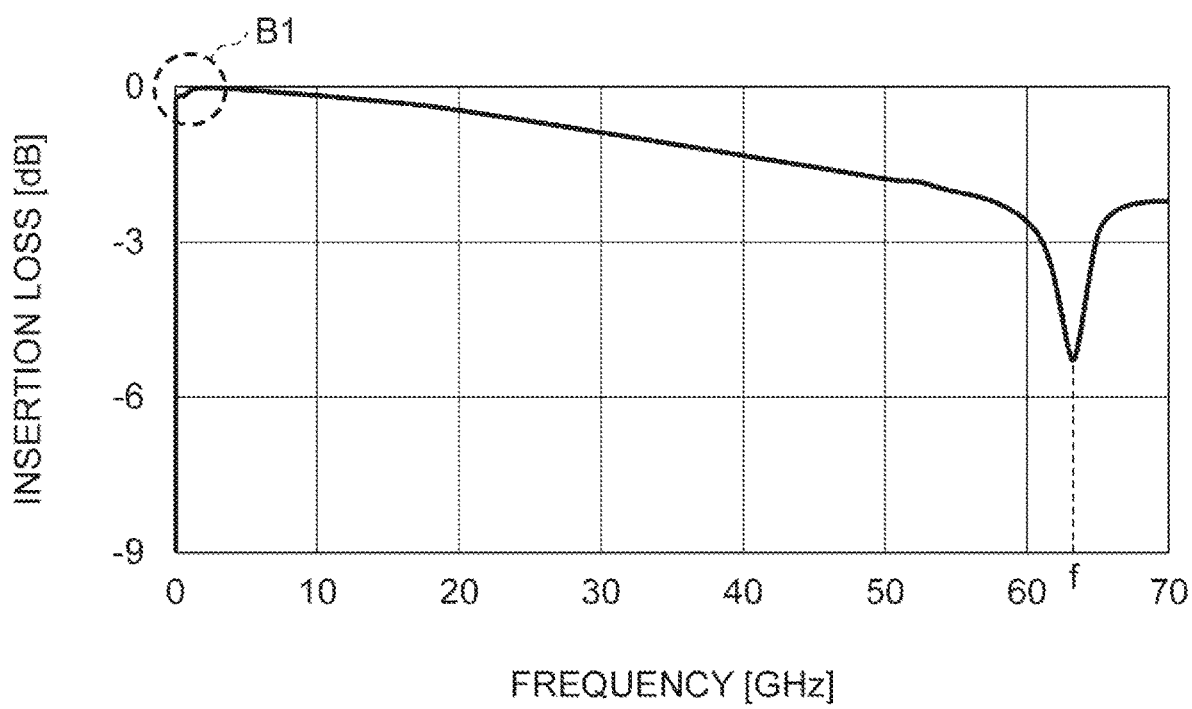
FIG. 6 is a graph of a simulated result of the relationship between insertion loss and signal frequency in the receiver module 1A.

FIG. 6 is a graph of a simulated result of the relationship between insertion loss (unit: dB) and signal frequency (unit: GHz) in the receiver module 1A according to the present embodiment. For a current optical communications system, 100 G transmission is becoming mainstream in a branch-line system and a data center, and between the branch-line system and the data center. From this time forward, there is a plan for further enhancement in speed, such as 400 G transmission. For the transmission speeds, clock frequency in transmission is in a range of 25 GHz to 56 GHz. In contrast to this, according to the present embodiment, as illustrated in FIG. 6, the resonant frequency f is more than 60 GHz. Thus, resonance can be avoided even in the clock frequency in transmission as described above.

Figure 7:
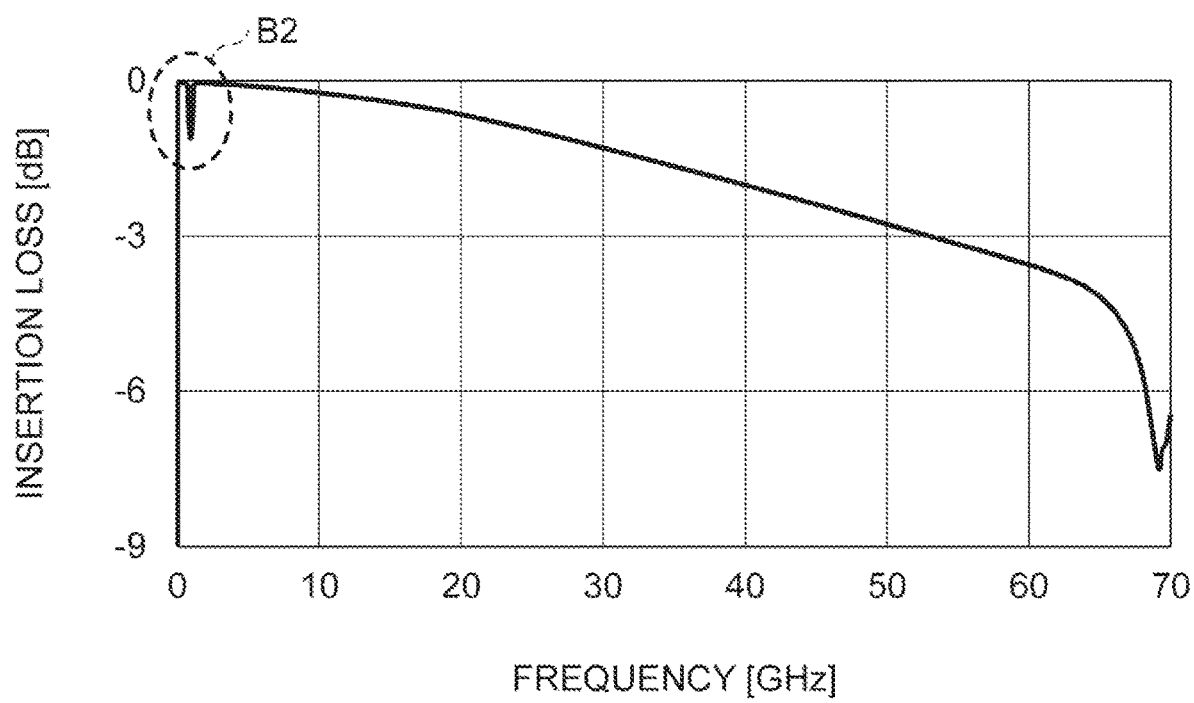
FIG. 7 illustrates a simulated result of the relationship between insertion loss and signal frequency in a case where no resistor is provided.

Note that, according to the present embodiment, only the conductive pattern 26 is interposed between the cathode of the photodiode 20 and the conductors 43. However, a resistor may be interposed between the cathode of the photodiode 20 and the conductors 43 (e.g., between a portion connected to the cathode of the photodiode 20, of the conductive pattern 26 and the portion 26c). FIG. 7 illustrates a simulated result of the relationship between insertion loss and signal frequency in a case where such a resistor is not provided. As illustrated in FIG. 7, without the resistor, resonance occurs in a low frequency band of approximately 1 GHz (B2 in the figure). In contrast to this, as illustrated in FIG. 6, with the resistor, the resonance in the low frequency band is inhibited effectively (B1 in the figure).

As in the present embodiment, the conductors 43 may be made of material the same as the material of the bonding wires 41 and 42, and each may be a conductor (e.g., a gold ribbon) thicker than the bonding wires 41 and 42. For example, such a configuration can make the inductance of the conductors 43 smaller than the inductance of the bonding wires 41 and 42, easily, with the sum of the cross-sectional areas of the conductors 43 larger than the sum of the cross-sectional areas of the bonding wires 41 and 42.

As in the present embodiment, the capacitance of the capacitor 24 may be larger than the capacitance of the parasitic capacitor between the conductive pattern 26 and the surface of the base 23. This arrangement enables reduction of the influence of the capacitor 24 on the signal-transmission characteristic in a high frequency band of several tens of megahertz.

As in the present embodiment, the photodiode 20 may be conductively joined to the portion between the connection (portion 26c) with the capacitor 24, of the conductive pattern 26 and the connections (portions 26a and 26b) with the bonding wires 41 and 42, of the conductive pattern 26. For example, such a configuration enables disposition of the capacitor 24 without interfering with provision of the bonding wires 41 and 42 (without lengthening). Thus, this arrangement enables keeping signal transmission properties at good condition in the high frequency band.

(First Modification)

Figure 8:
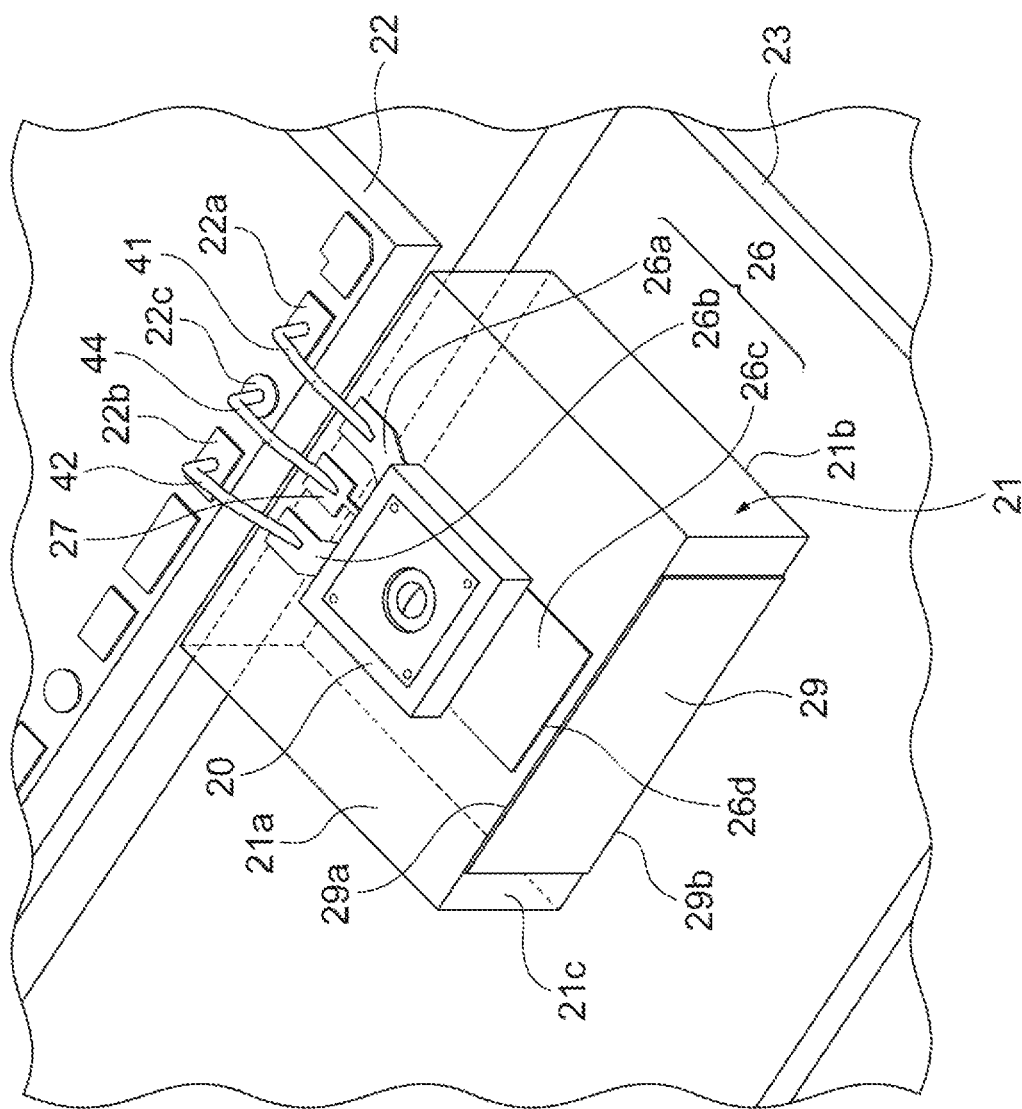
FIG. 8 is an enlarged perspective view of part of a receiver module according to a first modification.
Figure 9:
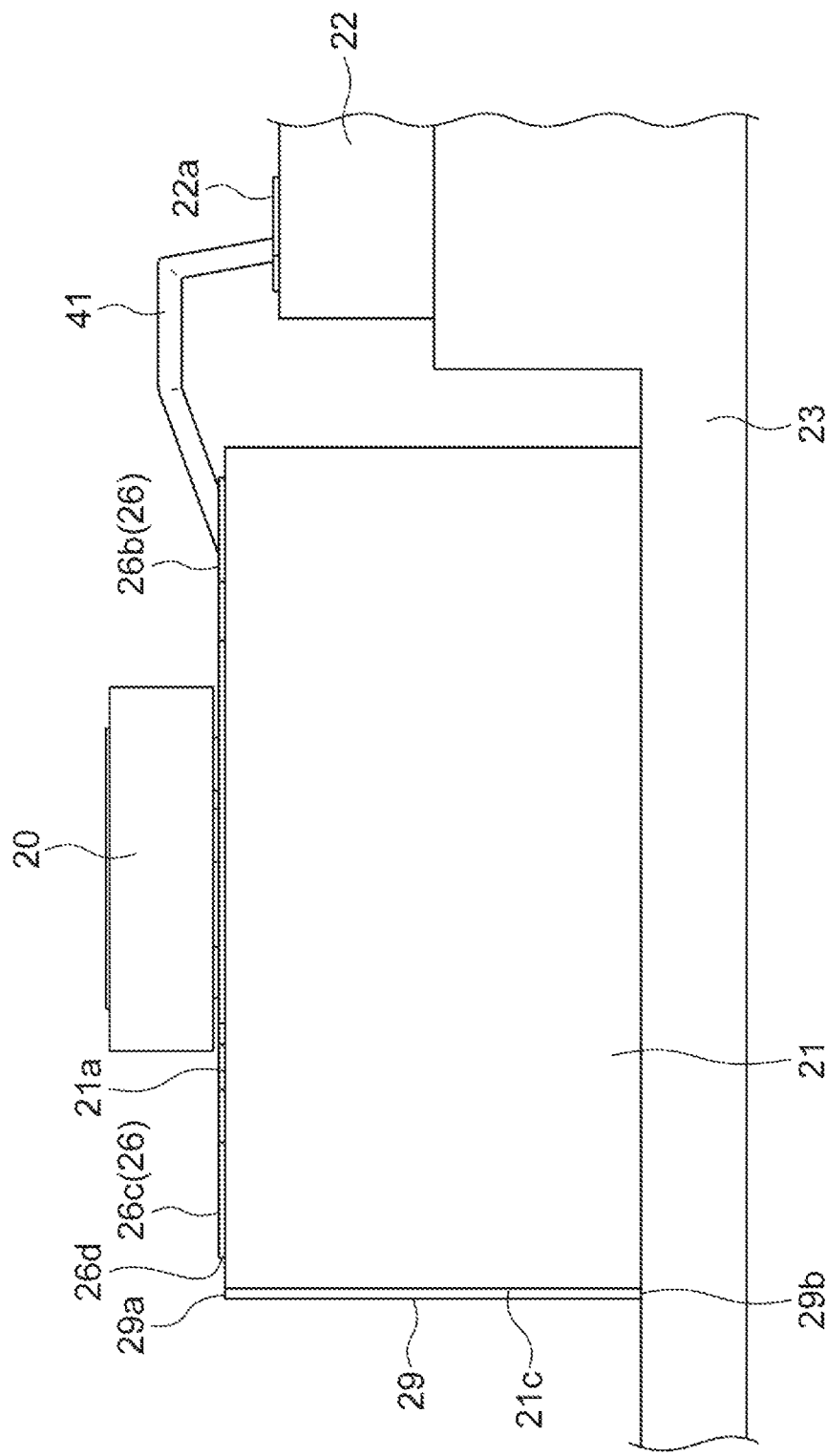
FIG. 9 is an enlarged side view of the part of the receiver module according to the first modification.

FIG. 8 is an enlarged perspective view of part of a receiver module according to a first modification of the embodiment, and FIG. 9 is a side view thereof. The difference between the present modification and the embodiment, is the configuration of a capacitor. The capacitor according the present modification that is not a chip capacitor similar to the capacitor 24 according to the embodiment, is formed by conductive patterns formed on the surface of a carrier 21. Specifically, a portion 26c of a conductive pattern 26 provided on a surface 21a of the carrier 21, extends into proximity to the edge on the far side with respect to a TIA 22, of a pair of edges of the surface 21*a* in a direction A1. An edge 26*d* of the portion 26*c* extends along the edge of the surface 21*a* (e.g., in parallel). Meanwhile, a conductive pattern 29 is provided on the side face 21*c* on the far side with respect to the TIA 22, of a pair of mutually opposing side faces of the carrier 21 in the direction A1. The conductive pattern 29 is a metallic pattern adhering to the side face 21*c*. From a pair of edges 29*a* and 29*b* of the conductive pattern 29 in the thickness direction of the carrier 21, the edge 29*a* on the far side with respect to a base 23, extends along the upper edge of the side face 21*c* in the thickness direction of the carrier 21 (e.g., in parallel). That is, the edge 29*a* of the conductive pattern 29 extends along the edge 26*d* of the conductive pattern 26, spaced apart from the edge 26*d* by a constant interval (e.g. in parallel). The edge 29*b* of the conductive pattern 29 is joined to the surface of the base 23 through conductive adhesive (e.g., silver paste), resulting in electric connection (short-circuit) with the surface of the base 23. The capacitor according to the present modification, is a parasitic capacitance formed between the edge 29*a* of the conductive pattern 29 and the edge 26*d* of the conductive pattern 26. That is, the capacitor has one end formed by part of the conductive pattern 26 and the other end electrically connected to the surface of the base 23. The capacitance of the parasitic capacitor is, for example, 1 pF.

According to the present modification, effect similar to that according to the embodiment can be acquired and the capacitor can be achieved easily. No component is required for the capacitor, separately from the carrier 21, resulting in contribution to miniaturization of the receiver module. According to the present modification, the conductors 43 according to the embodiment can be omitted, and the capacitor and the cathode of a photodiode 20 can be connected through only the conductive pattern 26. Thus, the inductance between the capacitor and the cathode of the photodiode 20 is considerably small, and is close to zero or substantially zero. Therefore, in comparison to the embodiment, the resonant frequency between the conductive pattern 26 and the surface of the base 23 can be made remarkably higher than the resonant frequency resulting from only the conductive pattern 26 and bonding wires 41 and 42. Thus, the resonant frequency of the entire circuit can further increase, so that an impassable band due to resonance can be further shifted to high frequency.

(Second Modification)

Figure 10:
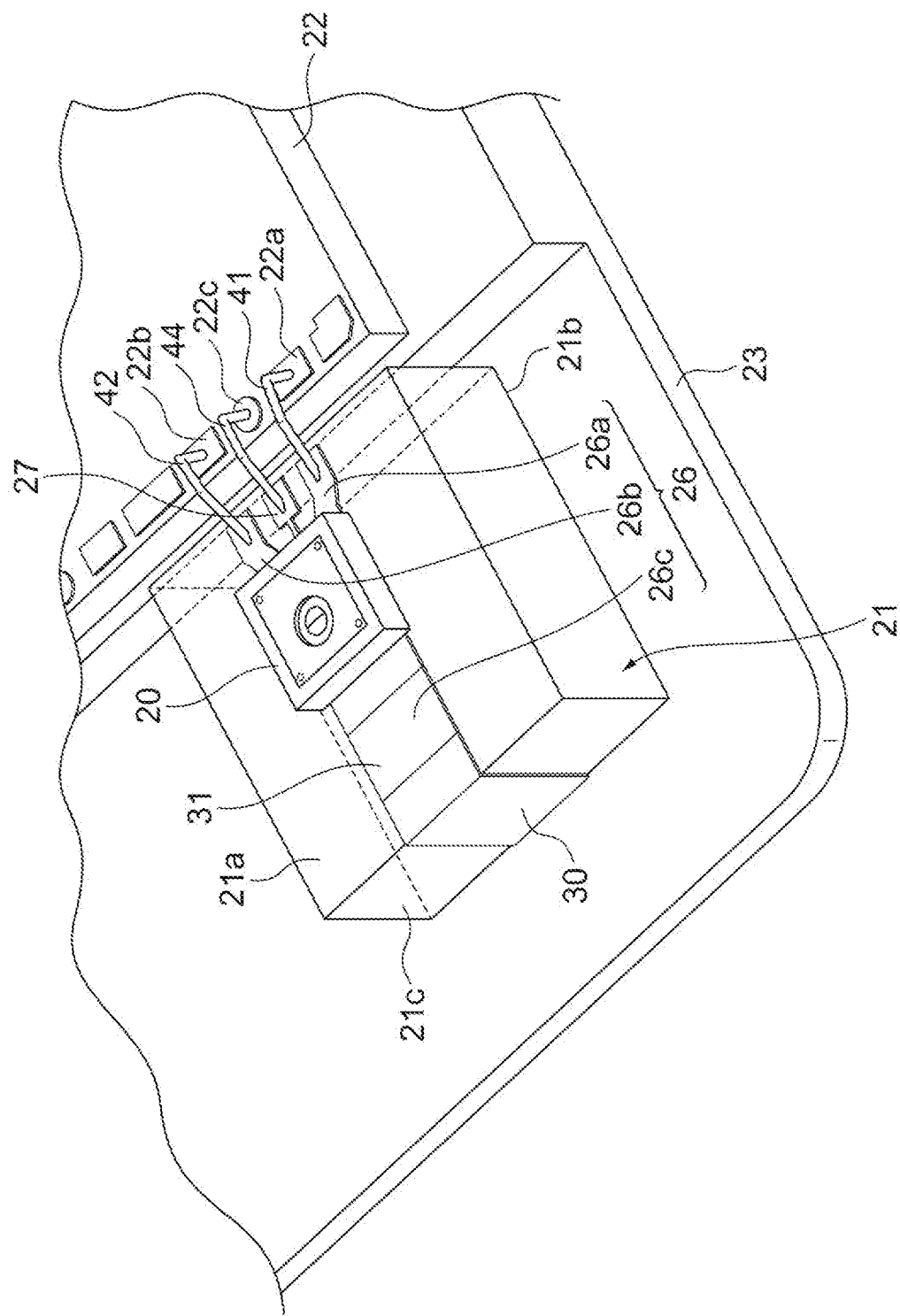
FIG. 10 is an enlarged perspective view of part of a receiver module according to a second modification.

FIG. 10 is an enlarged perspective view of part of a receiver module according to a second modification of the embodiment. The difference between the present modification and the embodiment, is the configuration of a capacitor. That is, a carrier 21 according to the present modification is made of silicon. The capacitor is achieved by a capacitor 31 formed on a surface 21*a* of the carrier 21. The capacitor 31 includes a conductive pattern formed such that one or a plurality of grooves formed on the surface 21*a* of the carrier 21 made of silicon is filled with the conductive pattern. One end of the capacitor 31 (one electrode) adjacent to a portion 26*c* of a conductive pattern 26, is connected to the portion 26*c*. The other end of the capacitor 31 (other electrode) is connected to one end on the surface 21*a*, of a conductive pattern 30 provided from the surface 21*a* over a side face 21*c* of the carrier 21. The other end of the conductive pattern 30 provided on the side face 21*c*, is joined to the surface of the base 23 through conductive adhesive (e.g., silver paste), resulting in electric connection (short circuit) with the surface of the base 23. Note that, instead of the conductive pattern 30 or together with the conductive pattern 30, the other end of the capacitor 31 and the surface of the base 23 may be connected to each other through a via penetrating in the thickness direction of the carrier 21. The capacitor 31 may be made of other dielectric material different from silicon.

The configuration according to the present modification enables acquisition of effect similar to that according to the embodiment. According to the present modification, the conductors 43 according to the embodiment can be omitted, similarly to the first modification, so that the capacitor and the cathode of a photodiode 20 can be connected through only the conductive pattern 26. Thus, the inductance between the capacitor and the cathode of the photodiode 20 is considerably small, and is close to zero or substantially zero. Therefore, in comparison to the embodiment, the resonant frequency between the conductive pattern 26 and the surface of the base 23 can be made remarkably higher than the resonant frequency resulting from only the conductive pattern 26 and bonding wires 41 and 42. Thus, the resonant frequency of the entire circuit can further increase, so that an impassable band due to resonance can be further shifted to high frequency.

As in the present embodiment, the capacitor may include the capacitor 31. This arrangement enables easy achievement of the capacitor. The capacitor that is relatively large in capacitance can be reduced in size and additionally no component is required for the capacitor, separately from the carrier 21, resulting in contribution to miniaturization of the receiver module.

A receiver module according to the present invention is not limited to the embodiment, and thus various modifications may be made. For example, a capacitor according to one embodiment of the present invention is not limited to the embodiment and the modifications, and thus various embodiments enabling acquisition of a capacitor can be applied. According to the embodiment and the modifications, the capacitor is disposed such that the photodiode is positioned between the capacitor and the TIA. However, disposition of the capacitor is not limited to this, and thus the capacitor may be disposed at various positions in the vicinity of the photodiode.

What is claimed is:

1. A receiver, comprising:
   a photodiode provided on a carrier composed of insulator material;
   a base having a conductive pattern connected to reference voltage, the conductive pattern provided on a surface of the base, and the carrier provided on the conductive pattern;
   a conductive film provided on the carrier, and electrically connected to a cathode of the photodiode, which has a parasitic capacitance between the surface of the base;
   a transimpedance amplifier (TIA) has a first terminal connecting to the conductive film via a bonding wire and a second terminal electrically connecting to an anode of the photodiode;
   a capacitor has one end electrically connecting to the conductive film via a conductor, has inductance less than inductance of the bonding wire and other end electrically connecting to the conductive pattern of the base;
   wherein the conductor comprises another bonding wire or a ribbon.

2. The receiver of claim 1
   wherein the conductor being a same material composed of the bonding wire, and a width of the conductor being more than a width of the bonding wire.

3. A receiver, comprising:

a photodiode provided on a carrier composed of insulator material;

a base having a conductive pattern connected to reference voltage, the conductive pattern provided on a surface of the base, and the carrier provided on the conductive pattern;

a conductive film provided on the carrier, and electrically connected to a cathode of the photodiode, which has a parasitic capacitance between the surface of the base;

a transimpedance amplifier (TIA) has a first terminal connecting to the conductive film via a bonding wire and a second terminal electrically connecting to an anode of the photodiode;

a capacitor has one end electrically connecting to the conductive film via a conductor, and other end electrically connecting to the conductive pattern of the base;

wherein the conductor comprises another bonding wire or a ribbon.

4. The receiver of claim 3:

wherein the capacitor being a thin silicon condenser.

5. The receiver of claim 3:

wherein the capacitor having a capacity value more than a capacity value of the parasitic capacitance.

6. The receiver of claim 1:

wherein the photodiode electrically connecting between a first portion of the conductive film connected to the capacitor and a second portion of the conductive film connected to the bonding wire.

7. The receiver of claim 1:

wherein the receiver further comprises a feed-through connected to the TIA via bonding wires, the feed-through receiving a voltage signal from the TIA and outputting the voltage signal outside the receiver.

8. The receiver of claim 1:

wherein the TIA has a first surface mounted on the surface of the base and a second surface opposite the first surface, the first terminal and the second terminal located on the second surface.

* * * * *